(12) United States Patent
Lee et al.

(10) Patent No.: US 9,818,708 B2
(45) Date of Patent: Nov. 14, 2017

(54) SEMICONDUCTOR DEVICE WITH THIN REDISTRIBUTION LAYERS

(71) Applicant: Amkor Technology, Inc., Tempe, AZ (US)

(72) Inventors: Dong Hoon Lee, Seoul (KR); Do Hyung Kim, Seongnam-si (KR); Seung Chul Han, Uijeongbu-si (KR)

(73) Assignee: AMKOR TECHNOLOGY, INC., Tempe, AZ (US)

( * ) Notice: Subject to any disclaimer, the term of this patent is extended or adjusted under 35 U.S.C. 154(b) by 0 days.

(21) Appl. No.: 15/471,615

(22) Filed: Mar. 28, 2017

(65) Prior Publication Data

US 2017/0221844 A1    Aug. 3, 2017

Related U.S. Application Data

(63) Continuation of application No. 14/444,450, filed on Jul. 28, 2014, now Pat. No. 9,607,919.

(30) Foreign Application Priority Data

Mar. 4, 2014    (KR) ........................ 10-2014-0026228

(51) Int. Cl.
*H01L 23/02*    (2006.01)
*H01L 23/00*    (2006.01)
(Continued)

(52) U.S. Cl.
CPC ............ *H01L 24/09* (2013.01); *H01L 21/486* (2013.01); *H01L 21/4857* (2013.01); *H01L 21/563* (2013.01); *H01L 23/3114* (2013.01); *H01L 23/3128* (2013.01); *H01L 23/3135* (2013.01); *H01L 23/49816* (2013.01);
(Continued)

(58) Field of Classification Search
CPC combination set(s) only.
See application file for complete search history.

(56) References Cited

U.S. PATENT DOCUMENTS 8,829,684 B2    9/2014    Tremlett et al.
9,000,586 B2    4/2015    Do et al.
(Continued)

FOREIGN PATENT DOCUMENTS

JP    4956128 B2    6/2012
KR    10-1247342 B    3/2013

*Primary Examiner* — Telly Green
(74) *Attorney, Agent, or Firm* — McAndrews, Held & Malloy, Ltd.

(57) ABSTRACT

A semiconductor device with thin redistribution layers is disclosed and may include forming a first redistribution layer on a dummy substrate, electrically coupling a semiconductor die to the first redistribution layer, and forming a first encapsulant layer on the redistribution layer and around the semiconductor die. The dummy substrate may be removed thereby exposing a second surface of the first redistribution layer. A dummy film may be temporarily affixed to the exposed second surface of the redistribution layer and a second encapsulant layer may be formed on the exposed top surface of the semiconductor die, a top surface and side edges of the first encapsulant layer, and side edges of the first redistribution layer. The dummy film may be removed to again expose the second surface of the first redistribution layer, and a second redistribution layer may be formed on the first redistribution layer and on the second encapsulant layer.

20 Claims, 8 Drawing Sheets

(51) Int. Cl.
  *H01L 23/31* (2006.01)
  *H01L 23/498* (2006.01)
  *H01L 23/538* (2006.01)
  *H01L 21/48* (2006.01)
  *H01L 21/56* (2006.01)

(52) U.S. Cl.
  CPC ...... *H01L 23/5384* (2013.01); *H01L 23/5385* (2013.01); *H01L 24/13* (2013.01); *H01L 24/81* (2013.01); *H01L 2224/02331* (2013.01); *H01L 2924/181* (2013.01)

(56) References Cited

U.S. PATENT DOCUMENTS

| | | |
|---|---|---|
| 2008/0079157 A1 | 4/2008 | Kurita et al. |
| 2011/0254156 A1 | 10/2011 | Lin |
| 2013/0084678 A1 | 4/2013 | Jeong |
| 2014/0070421 A1 | 3/2014 | Tremlett et al. |
| 2014/0124949 A1 | 5/2014 | Paek et al. |
| 2014/0131856 A1 | 5/2014 | Do et al. |
| 2015/0255361 A1 | 9/2015 | Lee et al. |

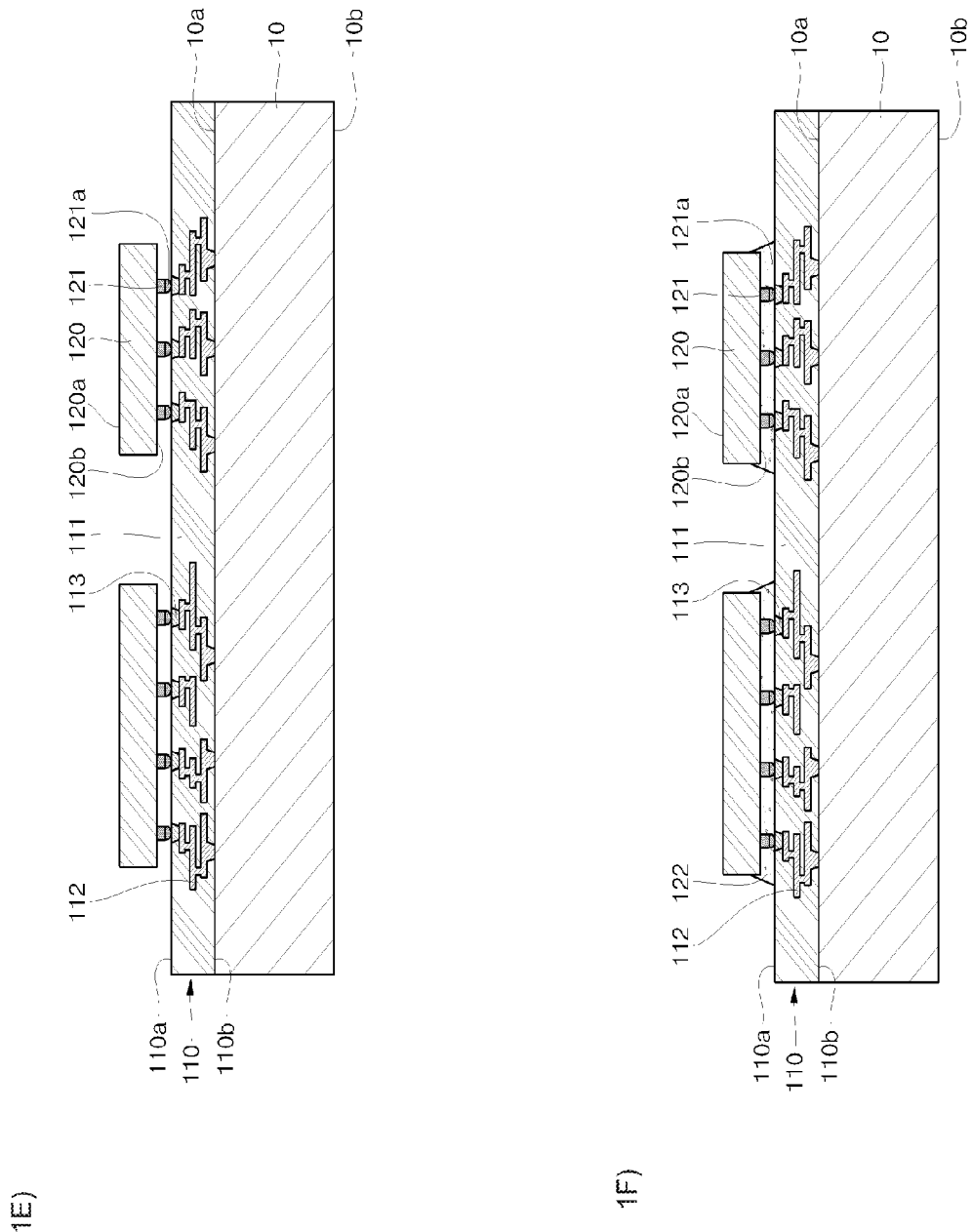

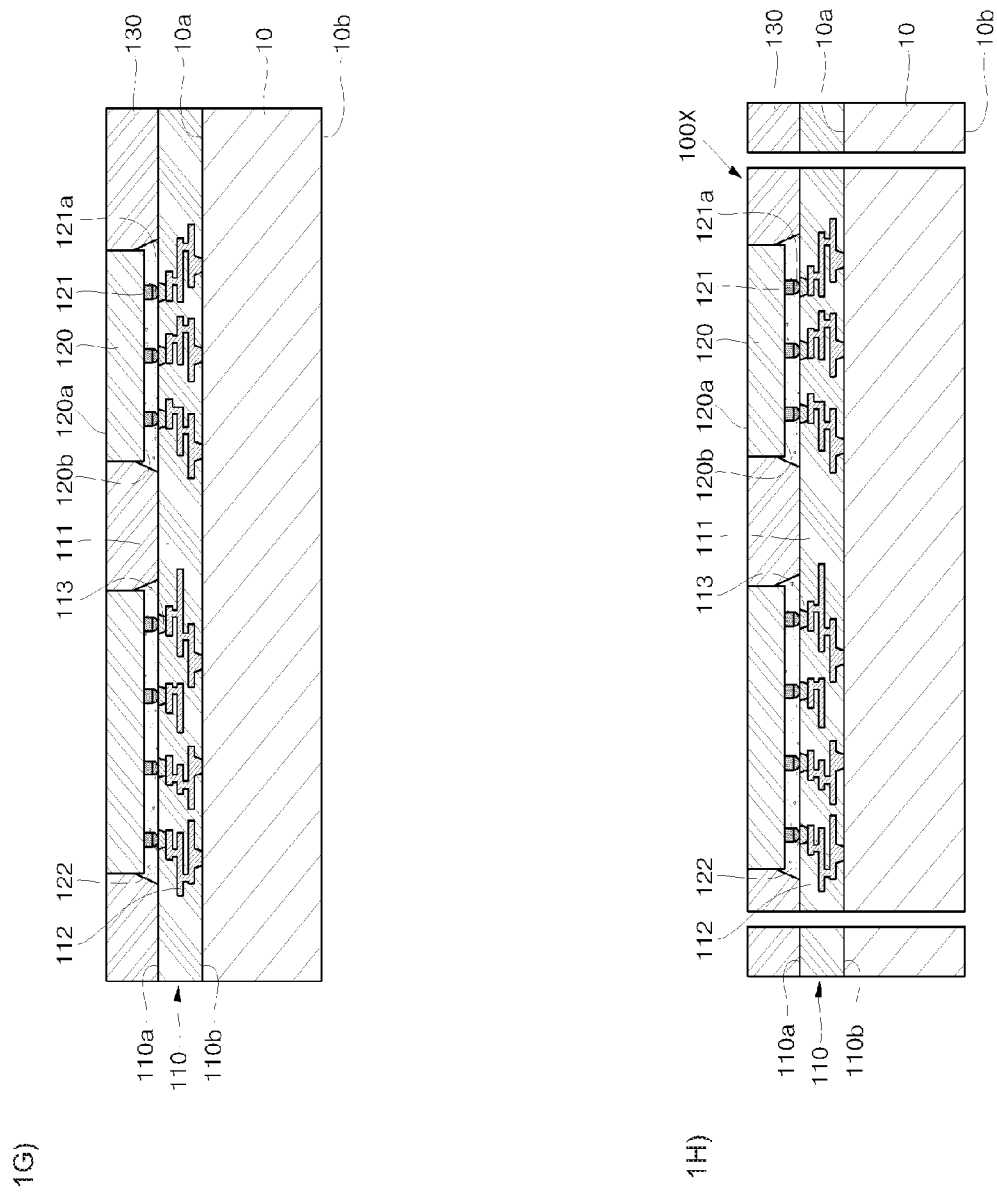

SEMICONDUCTOR DEVICE WITH THIN REDISTRIBUTION LAYERS

CROSS REFERENCE TO RELATED APPLICATIONS

The present application is a CONTINUATION of U.S. patent application Ser. No. 14/444,450, filed Jul. 28, 2014, expected to issue as U.S. Pat. No. 9,607,919 on Mar. 28, 2017, and entitled "A SEMICONDUCTOR DEVICE WITH THIN REDISTRIBUTION LAYERS," which makes reference to, claims priority to, and claims the benefit of Korean Patent Application No. 10-2014-0026228, filed on Mar. 4, 2014. The above-identified applications are hereby incorporated herein by reference, in their entirety.

FIELD

Certain embodiments of the disclosure relate to semiconductor chip packaging. More specifically, certain embodiments of the disclosure relate to a semiconductor device with thin redistribution layers.

BACKGROUND

In general, a semiconductor package includes a semiconductor die, a plurality of leads electrically connected to the semiconductor die and an encapsulant encapsulating the semiconductor die and the leads. In general, a POP (Package On Package) refers to a technique for vertically stacking packages incorporating at least one semiconductor die. Since the packages are individually tested and only tested packages may be stacked, the POP is advantageous in view of assembling yield.

However, in the conventional POP, since a relatively thick printed circuit board (PCB) is typically used as a substrate and a solder ball having a relatively large diameter is used as an internal conductor, the overall thickness of the POP is approximately 1 mm or greater. In addition, a circuit pattern formed on the substrate has a width of approximately 10 μm or greater.

The PCB includes a variety of organic materials, and the coefficient of the thermal expansion of the organic material may be significantly different from that of an inorganic material, such as the semiconductor die or an encapsulant, a considerably severe warping phenomenon may occur to the completed POP.

Additionally, in order to fabricate a POP, the costly PCB must be purchased, increasing the manufacturing cost of the POP.

Further limitations and disadvantages of conventional and traditional approaches will become apparent to one of skill in the art, through comparison of such systems with the present disclosure as set forth in the remainder of the present application with reference to the drawings.

BRIEF SUMMARY

A semiconductor device with thin redistribution layers, substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Figures 1A, 1B:
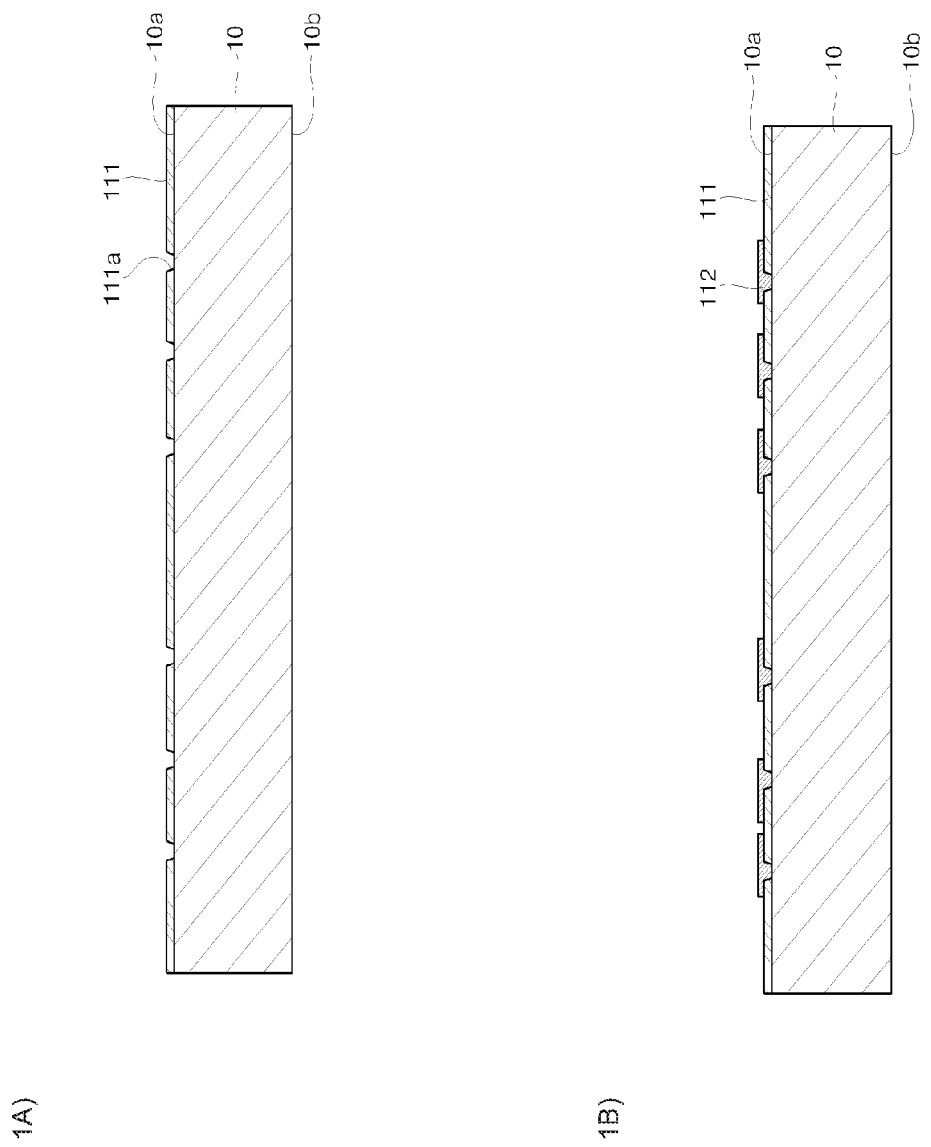
FIGS. 1A-1O are cross-sectional views illustrating a manufacturing method of a semiconductor device, in accordance with an example embodiment of the present disclosure.

Certain aspects of the disclosure may be found in a semiconductor device with thin redistribution layers. Example aspects of the disclosure may comprise forming a first redistribution layer on a dummy substrate, electrically coupling a semiconductor die to a first surface of the first redistribution layer, and forming a first encapsulant layer on the first surface of the redistribution layer and around the semiconductor die leaving a top surface of the semiconductor die exposed. The dummy substrate may be removed thereby exposing a second surface of the first redistribution layer. A dummy film may be temporarily affixed to the exposed second surface of the redistribution layer and a second encapsulant layer may be formed on the exposed top surface of the semiconductor die, a top surface and side edges of the first encapsulant layer, and side edges of the first redistribution layer. The dummy film may be removed to again expose the second surface of the first redistribution layer, and a second redistribution layer may be formed on the second surface of the first redistribution layer and on a bottom surface of the second encapsulant layer. An underfill material may be formed between the semiconductor die and the first surface of the first redistribution layer before the first encapsulant material is formed. The first encapsulant layer may be formed to a thickness such that a top surface of the first encapsulant layer is coplanar with the exposed top surface of the semiconductor die. A solder ball may be formed on the second redistribution layer. The solder ball may be electrically coupled to the semiconductor die via the first and second redistribution layers. The dummy film may be wider than the first redistribution layer. The second redistribution layer may be wider than the first redistribution layer. The dummy substrate and first redistribution layer may be singulated into individual modules before removing the dummy substrate. The bottom surface of the second encapsulant layer may be coplanar with the second surface of the second redistribution layer. The thickness of the first redistribution layer may be 10 μm or less. The first redistribution layer may be formed by forming a dielectric layer on the dummy substrate, forming holes in the dielectric layer, and depositing one or more metal layers in the formed holes and on the first dielectric layer.

Various aspects of the present disclosure may be embodied in many different forms and should not be construed as being limited to the example embodiments set forth herein. Rather, these example embodiments are provided so that this disclosure will be thorough and complete and will fully convey the various aspects of the disclosure to those skilled in the art.

In the drawings, the thickness of layers and regions are exaggerated for clarity. Here, like reference numerals refer to like elements throughout. As used herein, the term "and/or" includes any and all combinations of one or more of the associated listed items.

In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises" and/or "comprising," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

FIGS. 1A to 1O are cross-sectional views illustrating a manufacturing method of a semiconductor device, in accordance with an example embodiment of the present disclosure.

Referring to FIGS. 1A to 1D, cross-sectional views illustrating forming of a first redistribution layer (110) are illustrated.

First, as illustrated in FIG. 1A, a dummy substrate 10 having a substantially planar first surface 10a and a substantially planar second surface 10b opposite to the first surface 10a is prepared, and a first dielectric layer 111 is formed on the first surface 10a of the dummy substrate 10. The dummy substrate 10 may comprise, for example, silicon, low-grade silicon, glass, silicon carbide, sapphire, quartz, ceramic, metal oxide, a metal, or equivalents thereof, but aspects of the present disclosure are not limited thereto. The first dielectric layer 111 may be deposited on the first surface 10a of the dummy substrate 10 by chemical vapor deposition (CVD), and first openings 111a may be formed by patterning using a photolithography process and/or a laser process. A portion of the first surface 10a of the dummy substrate 10 may be exposed to the outside by the first openings 111a. The first dielectric layer 111 may include, for example, silicon oxide, silicon nitride or equivalents thereof, but aspects of the present disclosure are not limited thereto.

As illustrated in FIG. 1B, first conductive layers 112 may be formed on the first openings 111a and the first dielectric layer 111. Accordingly, the first conductive layers 112 may make direct contact with the first surface 10a of the dummy substrate 10 through the first openings 111a. The first conductive layers 112 may be formed, for example, by an electroless plating process for a seed layer based on gold, silver, nickel, titanium and/or tungsten, an electroplating process using copper, or a photolithography process using photoresist, but aspects of the present disclosure are not limited thereto. In addition, the first conductive layers 112 may include not only copper but also, for example, a copper alloy, aluminum, an aluminum alloy, iron, an iron alloy or equivalents thereof, but aspects of the present disclosure are not limited thereto.

Figure 1C:
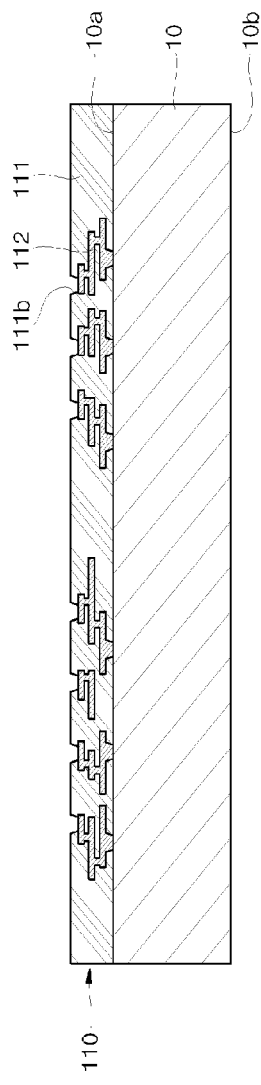

As illustrated in FIG. 1C, the process of forming the first dielectric layer 111 and the process of forming the first conductive layers 112 may be repeated multiple times, thereby completing the first redistribution layer 110 having a multi-layered structure. That is to say, the first redistribution layer 110 may comprise a first surface 110a and a second surface 110b opposite to the first surface 110a, and the first conductive layers 112 may be exposed to the first surface 110a and the second surface 110b. The first redistribution layer 110 may, for example, comprise a dielectric layer and conductive layers only. However, unlike in a conventional PCB (e.g., a rigid PCB or a flexible PCB), an organic core layer or an organic build-up layer might not be provided in the first redistribution layer 110. Therefore, the first redistribution layer 110 may be formed considerably thinner. For example, the first redistribution layer 110 may be formed to a thickness of 10 μm or less. By contrast, a conventional PCB may generally be formed to a thickness in a range of 200 μm to 300 μm.

As described above, since the first redistribution layer 110 may be formed by a fabrication (FAB) process, the first conductive layers 112 may be formed with a width, thickness, and/or pitch in a range of 20 nm to 1000 nm. Therefore, the present disclosure may provide considerably fine first conductive layers 112, thereby accommodating highly integrated semiconductor die. By contrast, redistributions of conventional PCBs have been generally formed with a width, thickness and/or pitch in a range of 20 μm to 30 μm.

Here, openings 111b may be formed on the first dielectric layer 111 of the first surface 110a of the first redistribution layer 110, and some regions of the first conductive layers 112 may be directly exposed to the outside.

Figure 1D:
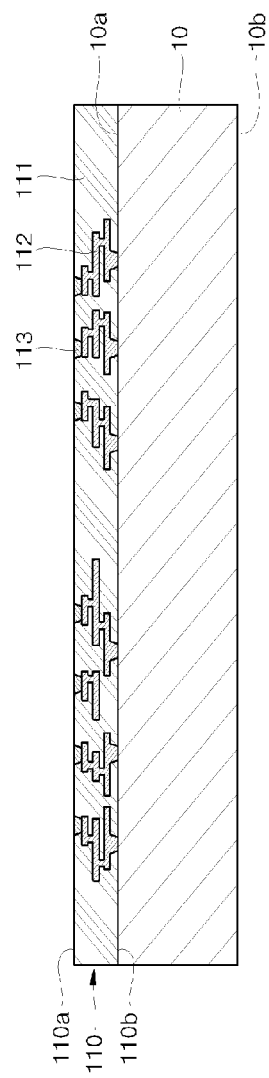

As illustrated in FIG. 1D, a conductive pad 113 may further be formed on the directly exposed first conductive layers 112 exposed through the first surface 110a of the first redistribution layer 110. The conductive pad 113 may, for example, be formed by a general plating process or photolithography. The conductive pad 113 may be formed to allow a semiconductor die 120 to later be electrically connected thereto and may comprise solder.

As illustrated in FIG. 1E, the semiconductor die 120 may be electrically connected to the first redistribution layer 110. The semiconductor die 120 has a first surface 120a and a second surface 120b opposite to the first surface 120a, and a conductive filler 121 may be provided on the second surface 120b. The semiconductor die 120 may be electrically connected to the conductive pad 113 formed on the first surface 110a of the first redistribution layer 110 through the conductive filler 121. That is to say, the semiconductor die 120 may be flip-chip bonded to the first redistribution layer 110. The conductive filler 121 may further include a solder cap 121a formed at its end to facilitate connection with the first redistribution layer 110.

As illustrated in FIG. 1F, an underfill 122 may be injected into a space between the semiconductor die 120 and the first redistribution layer 110 and then cured. That is to say, the underfill 122 may be interposed between the second surface 120b of the semiconductor die 120 and the first surface 110a of the first redistribution layer 110 and may be formed to cover the conductive filler 121 and the conductive pad 113. The semiconductor die 120 may be more stably fixed on the first redistribution layer 110 by the underfill 122. Even if there is a difference in the coefficient of thermal expansion between the semiconductor die 120 and the first redistribution layer 110, the semiconductor die 120 and the first redistribution layer 110 may be prevented from being electrically disconnected from each other. In some cases, if a dimension of the first encapsulant 130 (described below) is smaller than a gap between the semiconductor die 120 and the first redistribution layer 110, the first encapsulant 130 may directly fill the gap between the semiconductor die 120 and the first redistribution layer 110. Accordingly, the underfill 122 might not be provided.

As illustrated in FIG. 1G, the first redistribution layer 110 and the semiconductor die 120 may be encapsulated by the first encapsulant 130. The first encapsulant 130 may be formed to entirely cover the first surface 110a of the first redistribution layer 110 and the semiconductor die 120, followed by back grinding to allow the first surface 120a of the semiconductor die 120 to be exposed to the outside. The semiconductor die 120 and the first redistribution layer 110 may be protected from external surroundings by the first encapsulant 130. In addition, the first encapsulant 130 may generally include, for example, epoxy, a film, a paste or equivalents thereof, but aspects of the present disclosure are not limited thereto.

As illustrated in FIG. 1H, the first redistribution layer 110 and the first encapsulant 130 may be diced, thereby singulating individual semiconductor modules (100x). The dicing may be performed by, for example, blade dicing or using a dicing tool, but aspects of the present disclosure are not limited thereto.

Here, each of the semiconductor modules 100x may comprise the first redistribution layer 110 on which at least one semiconductor die 120 may be mounted and the semiconductor die 120 which may be encapsulated by the first encapsulant 130. That is to say, the first redistribution layer 110 having a plurality of semiconductor dies 120 mounted thereon may be separated into individual semiconductor modules 100x each having at least one semiconductor die 120. In FIG. 1H, two semiconductor die 120 are shown in each of the semiconductor modules 100x, but the present disclosure does not limit the number of semiconductor die in each of the semiconductor modules 100x. As the result of the dicing, side portions of the first redistribution layer 110 encapsulated by the first encapsulant 130 may be exposed to the outside.

Figures 1I, 1J:
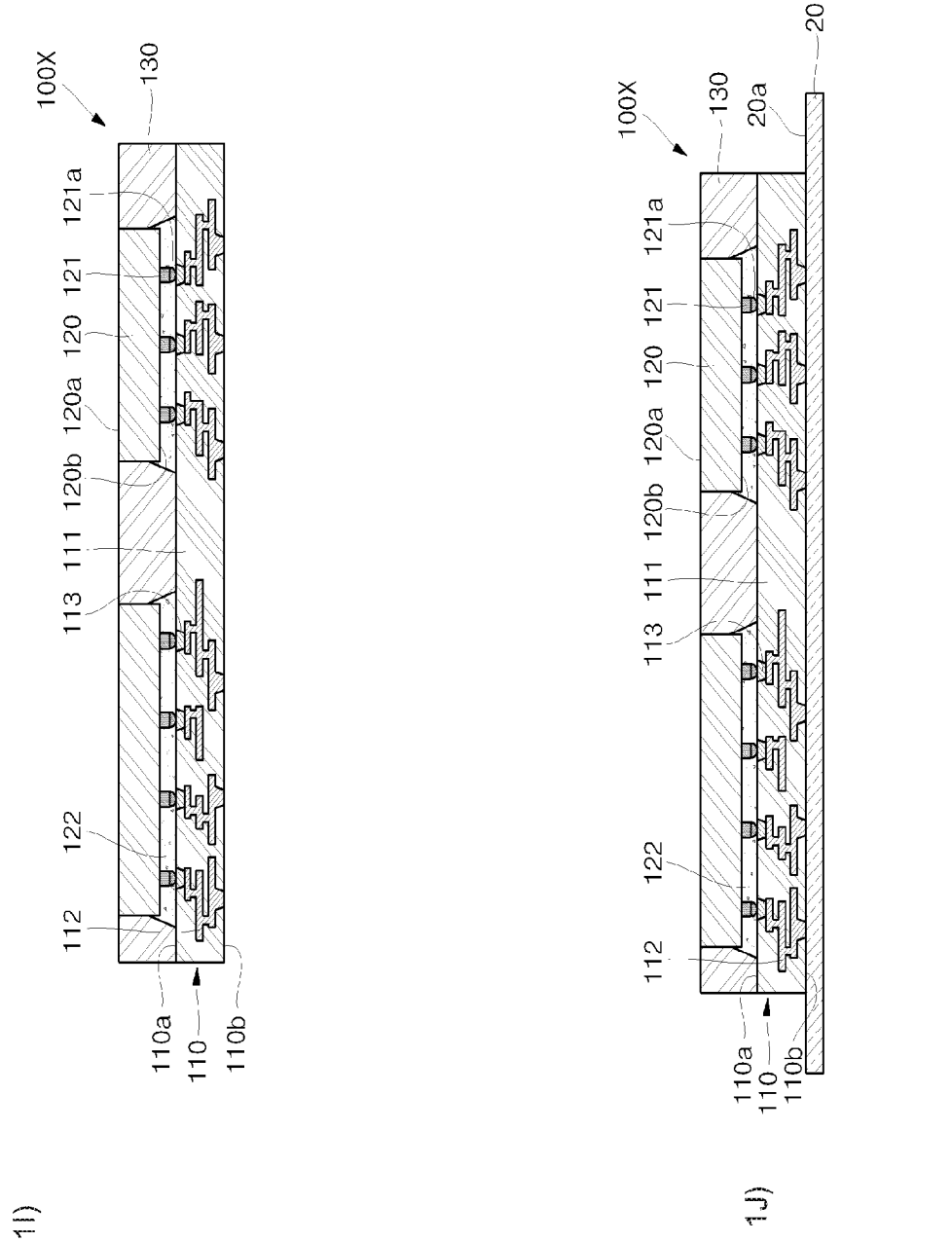

In addition, as illustrated in FIG. 1I, the dummy substrate 10 may be removed from each of the semiconductor modules 100x. In more detail, the dummy substrate 10 may be removed by grinding to a predetermined thickness using a wafer support system, and the dummy substrate 10 may then be completely removed by a dry etching process and/or a wet etching process. In such a manner, the second surface 110b of the first redistribution layer 110 may be exposed to the outside. That is to say, as a result of removing the dummy substrate 10, the first conductive layers 112 may be externally exposed to the second surface 110b of the first redistribution layer 110 through the first dielectric layer 111.

As illustrated in FIG. 1J, in each of the semiconductor modules 100x, a dummy film 20 may be attached to the second surface 110b of the first redistribution layer 110. The dummy film 20 may be larger than the second surface 110b of the first redistribution layer 110 in size. That is to say, a portion of a first surface 20a of the dummy film 20, other than a portion of the first surface 20a adhered to the first redistribution layer 110, may be exposed to the outside. Here, the first redistribution layer 110 of each of the semiconductor modules 100x may be adhered to a central portion of the first surface 20a of the dummy film 20 while a peripheral portion of the first surface 20a of the dummy film 20 is exposed to the outside.

Figures 1K, 1L:
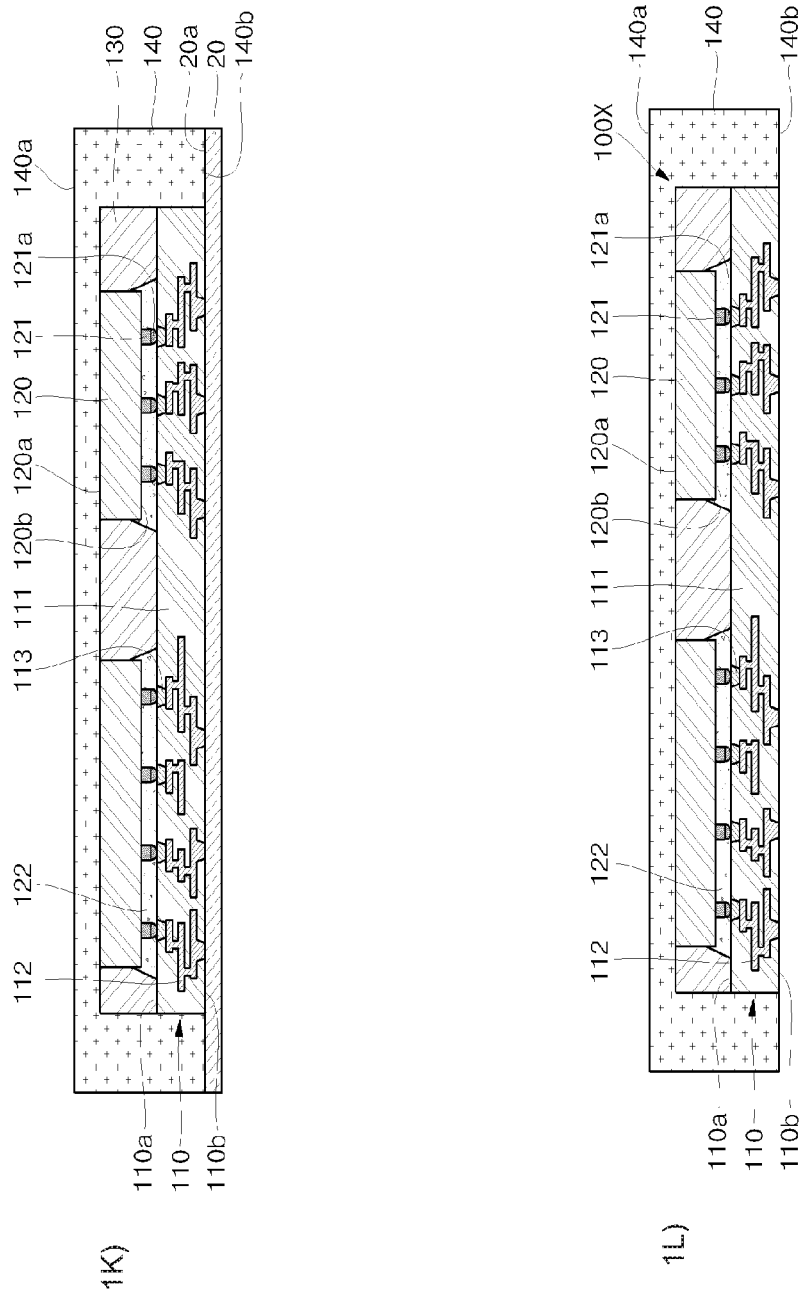

As illustrated in FIG. 1K, the dummy film 20, the first redistribution layer 110, the semiconductor die 120 and the first encapsulant 130 may be encapsulated by the second encapsulant 140. That is to say, the second encapsulant 140 may be formed to cover the first surface 20a of the dummy film 20, the side portion between the first surface 110a and the second surface 110b of the first redistribution layer 110, the first surface 120a of the semiconductor die 120, and the first encapsulant 130. The second encapsulant 140 may thus encapsulate all of the regions other than the second surface 110b of the first redistribution layer 110 attached to the dummy film 20 in each of the individual semiconductor modules 100x attached to the dummy film 20. The second encapsulant 140 may have a planar first surface 140a and a second surface 140b that is coplanar with the second surface 110b of the first redistribution layer 110. The second encapsulant 140 may, for example, include one of general epoxy, a film, a paste or equivalents thereof, but aspects of the present disclosure are not limited thereto.

As illustrated in FIG. 1L, after the forming of the second encapsulant 140, the dummy film 20 attached to the second surface 110a of the first redistribution layer 110 may be removed. An adhesive force of the dummy film 20 may be removed by UV light or heat, and the dummy film 20 may be isolated by picking up the second encapsulant 140. As a result of removing the dummy film 20, the second surface 110b of the first redistribution layer 110 is exposed to the outside. Here, the first conductive layers 112 may be external to the second surface 110b of the first redistribution layer 110 through the first dielectric layer 111. In addition, as a result of removing the dummy film 20, the second surface 140a of the second encapsulant 140 may also be exposed to the outside.

Figures 1M, 1N:
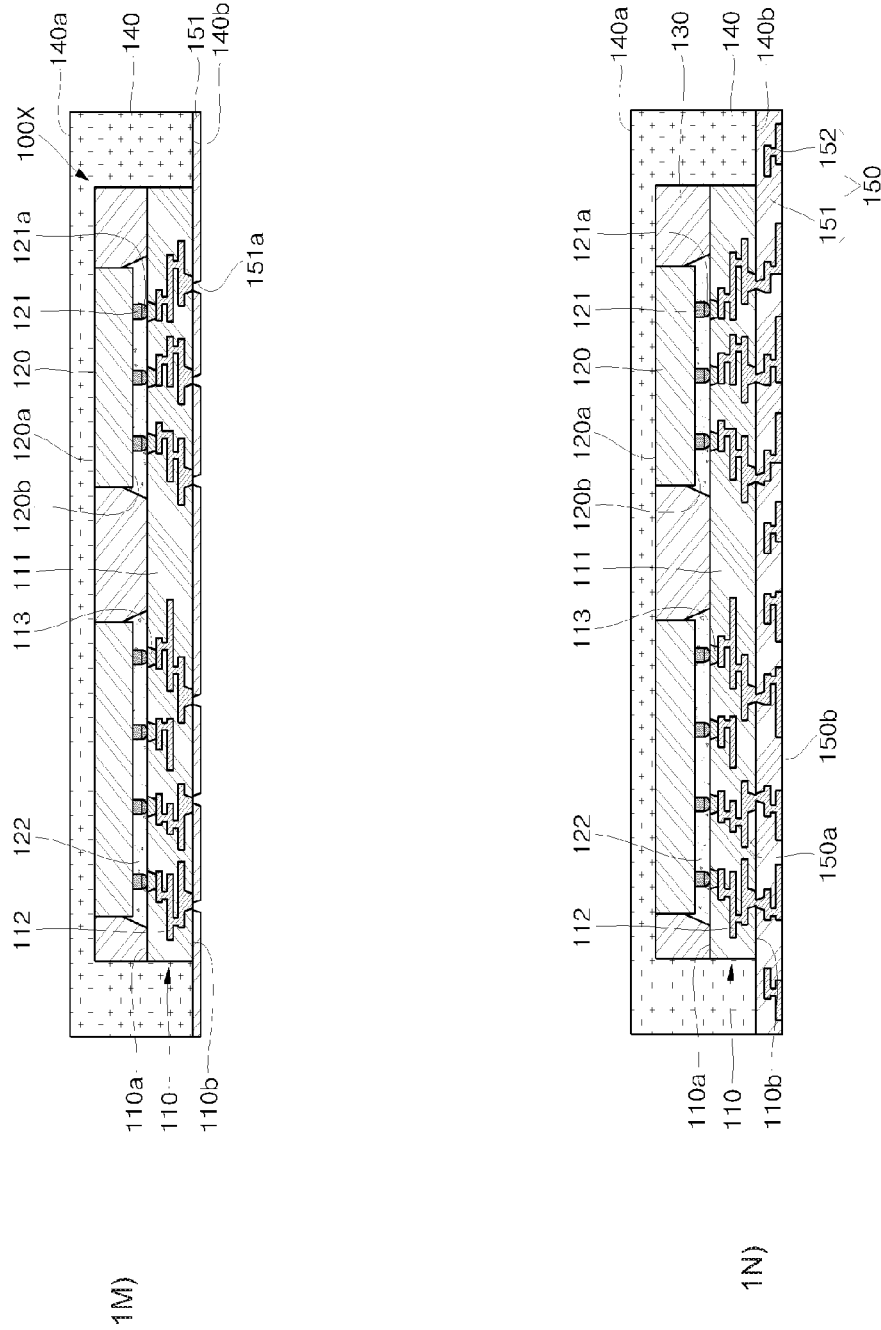
Figure 10:
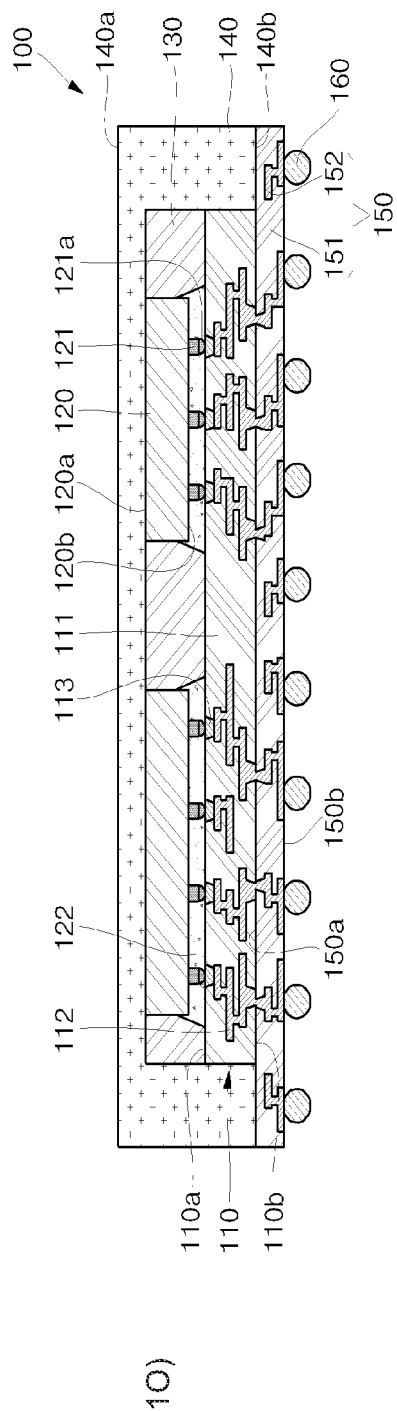

As illustrated in FIGS. 1M and 1N, a second dielectric layer 151 and a second conductive layer 152 may be formed on the second surface 110b of the first redistribution layer 110 and the second surface 140a of the second encapsulant 140, thereby forming a second redistribution layer 150. As illustrated in FIG. 1M, the second dielectric layer 151 may be deposited by a chemical vapor deposition (CVD) device to cover the second surface 110b of the first redistribution layer 110 and the second surface 140b of the second encapsulant 140, followed by patterning using a photolithography process and/or a laser process, thereby forming the second openings 151a. Some portions of the first conductive layers 112 of the first redistribution layer 110 may be exposed to the outside by the second openings 151a. The first dielectric layer 111 may include, for example, silicon oxide, silicon nitride or equivalents thereof, but aspects of the present disclosure are not limited thereto.

In addition, as illustrated in FIG. 1N, a second conductive layer 152 may be formed on the second openings 151a and the second dielectric layer 151. Accordingly, the second conductive layer 152 may make direct contact with the first conductive layers 112 of the first redistribution layer 110 through the second openings 151a. The second conductive layer 152 may be formed by an electroless plating process for a seed layer based on gold, silver, nickel, titanium and/or tungsten, an electroplating process using copper, or a photolithography process using photoresist, but aspects of the present disclosure are not limited thereto. In addition, the second conductive layer 152 may include not only copper but also, for example, a copper alloy, aluminum, an aluminum alloy, iron, an iron alloy or equivalents thereof, but aspects of the present disclosure are not limited thereto.

The process of forming the second dielectric layer 151 and the process of forming the second conductive layer 152 may be repeated multiple times, thereby completing the second redistribution layer 150 having a multi-layered structure. That is to say, the second redistribution layer 150 may comprise a first surface 150a and a second surface 150b opposite to the first surface 150a, and the second conductive layer 152 may be exposed to the first surface 150a and the second surface 150b. The first surface 150a of the second redistribution layer 150 may make contact with the second surface 110b of the first redistribution layer 110 and the second surface 140a of the second encapsulant 140 so as to entirely cover the same. That is to say, the first surface 150a of the second redistribution layer 150 may be larger than the second surface 110b of the first redistribution layer 110 in size. The second redistribution layer 150 may, for example, comprise the second dielectric layer 151 and the second conductive layer 152. However, unlike in a conventional PCB (e.g., a rigid PCB or a flexible PCB), an organic core layer or an organic build-up layer might not be provided in the second redistribution layer 150. Therefore, the second redistribution layer 150 may be formed considerably thinner. For example, the first redistribution layer 110 may be formed to a thickness of 10 µm or less. By contrast, the conventional PCB has been generally formed to a thickness in a range of 200 µm to 300 µm.

As described above, since the second redistribution layer 150 may be formed by a fabrication (FAB) process, the second conductive layer 152 may be formed with a width, thickness and/or pitch in a range of 20 nm to 1000 nm. Therefore, the present disclosure may provide considerably thinner and narrower second conductive layer 152, thereby accommodating highly integrated semiconductor die. By contrast, redistributions of conventional PCBs have been generally formed with a width, thickness and/or pitch in a range of 20 µm to 30 µm.

In addition, in the second redistribution layer 150, the second conductive layer 152 may make direct contact with the first conductive layers 151 of the first redistribution layer 110 to then be electrically connected to the first conductive layers 151. That is to say, since the second redistribution layer 150 may be directly formed on the second surface 110b of the first redistribution layer 110, a separate bump layer may not necessarily be provided for connection with a redistribution layer or a substrate, such as a PCB.

As illustrated in FIG. 1O, a solder ball 160 may be formed to be electrically connected to the second conductive layer 152 exposed to the second surface 150b of the second redistribution layer 150. For example, a volatile flux may be coated on a predetermined region of the second conductive layer 152 exposed to the outside through the second dielectric layer 151, and the solder ball 160 may be positioned on the flux, and then heated to ~150-250° C. to make the flux volatilize to connect the solder ball 160 to be connected to a region of the second conductive layer 152. Thereafter, the solder ball 160 may be completely mechanically/electrically connected to the second conductive layer 152 through a cooling process.

In such a manner, the semiconductor device 100 having a plurality of redistribution layers according to the present disclosure may be completed. In addition, another semiconductor device, package or component may further be mounted on the thus completed semiconductor device 100.

Meanwhile, as described above, according to the present disclosure, since a PCB might not be used, unlike in conventional devices, the semiconductor device 100 comprises a reduced thickness and good electrical properties by directly connecting conductive layers of the redistribution layers. That is to say, the semiconductor device 100 having a thickness of approximately 100 µm to approximately 200 µm by using a redistribution layer having a thickness of approximately 10 µm or less is provided. In addition, the semiconductor device 100 having good electrical properties (with a reduced loss in the power) may be provided by using redistributions having a width, thickness and/or pitch in a range of 20 nm to 30 nm. Further, since the second redistribution layer 150 may be directly formed on the first redistribution layer 110, the redistribution layers 110 and 150 may be directly connected to each other, thereby simplifying the process and improving electric properties of the semiconductor device 100. In addition, since the dielectric layers 111 and 151 included in the redistribution layers 110 and 150 may comprise inorganic material, it is possible to provide the semiconductor device 100 having a coefficient of thermal expansion similar to that of the semiconductor die 120 or the first encapsulant 130 and the second encapsulant 140 while suppressing a warp phenomenon.

Further, according to the present disclosure, since the redistribution layer may be formed using existing deposition equipment, plating equipment and/or photolithography equipment without purchasing the conventional PCB that is expensive, the semiconductor device 100 can be manufactured at a low cost.

This disclosure provides example embodiments. The scope of the present disclosure is not limited by these example embodiments. Numerous variations, whether explicitly provided for by the specification or implied by the specification, such as variations in structure, dimension, type of material and manufacturing process, may be implemented by one skilled in the art in view of this disclosure without departing from the spirit and scope of this disclosure.

In an example embodiment of the disclosure a semiconductor device with thin redistribution layers is disclosed and may comprise forming a first redistribution layer on a dummy substrate, electrically coupling a semiconductor die to a first surface of the first redistribution layer, and forming a first encapsulant layer on the first surface of the redistribution layer and around the semiconductor die leaving a top surface of the semiconductor die exposed. The dummy substrate may be removed thereby exposing a second surface of the first redistribution layer. A dummy film may be temporarily affixed to the exposed second surface of the redistribution layer and a second encapsulant layer may be formed on the exposed top surface of the semiconductor die, a top surface and side edges of the first encapsulant layer, and side edges of the first redistribution layer.

The dummy film may be removed to again expose the second surface of the first redistribution layer, and a second redistribution layer may be formed on the second surface of the first redistribution layer and on a bottom surface of the second encapsulant layer. An underfill material may be formed between the semiconductor die and the first surface of the first redistribution layer before forming the first encapsulant layer. The first encapsulant layer may be formed to a thickness such that a top surface of the first encapsulant layer is coplanar with the exposed top surface of the semiconductor die. A solder ball may be formed on the second redistribution layer. The solder ball may be electrically coupled to the semiconductor die via the first and second redistribution layers.

The dummy film may be wider than the first redistribution layer. The second redistribution layer may be wider than the first distribution layer. The dummy substrate and first redistribution layer may be singulated into individual modules before the dummy substrate is removed. The bottom surface of the second encapsulant layer may be coplanar with the second surface of the second redistribution layer. The thickness of the first redistribution layer may be 10 µm or less. The first redistribution layer may be formed by forming a dielectric layer on the dummy substrate, forming holes in the dielectric layer, and depositing one or more metal layers in the formed holes and on the first dielectric layer.

While various aspects of the present disclosure have been described with reference to certain supporting embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the scope of various aspects of the present disclosure not be limited to the particular embodiments disclosed, but that the present invention will include all embodiments falling within the scope of the appended claims.

What is claimed is:

1. A semiconductor device comprising:
a first signal distribution structure having a top side and a bottom side, the first signal distribution structure comprising:
   a plurality of dielectric layers comprising a first dielectric layer and a second dielectric layer; and
   a plurality of first conductive layers comprising:
      a first conductive via extending through the first dielectric layer;
      a second conductive via extending through the second dielectric layer; and
      a trace extending laterally between and electrically connecting the first conductive via and the second conductive via;
a first semiconductor die on the top side of the first signal distribution structure;
a second semiconductor die on the top side of the first signal distribution structure;
a first encapsulating material on the top side of the first signal distribution structure and laterally surrounding the first and second semiconductor dies, wherein all lateral sides of the trace are separated from the first encapsulating material by at least one intervening layer of the first signal distribution structure;
a second encapsulating material on at least: a top side of the first semiconductor die, a top side of the second semiconductor die, a top side and lateral sides of the first encapsulating material, and lateral sides of the first signal distribution structure; and
a second signal distribution structure on a bottom side of the first signal distribution structure and on a bottom side of the second encapsulating material.

2. The semiconductor device of claim 1, wherein the at least one intervening layer comprises the first dielectric layer.

3. The semiconductor device of claim 1, wherein a top side of the trace is separated from the first encapsulating material by at least one intervening layer.

4. The semiconductor device of claim 3, wherein the at least one intervening layer separating the top side of the trace from the first encapsulating material comprises the first dielectric layer.

5. The semiconductor device of claim 1, wherein the at least one intervening layer separates the trace and all laterally running traces of the first signal distribution structure from direct contact with the first encapsulating material.

6. The semiconductor device of claim 1, wherein a top side of the first conductive via and a top side of the plurality of dielectric layers are coplanar.

7. The semiconductor device of claim 1, comprising underfill material between the first semiconductor die and the first signal distribution structure, wherein all lateral sides of the trace and of all laterally running traces of the first signal distribution structure are separated from the underfill material.

8. The semiconductor device of claim 1, wherein the trace and the second conductive via are portions of a same plated metal layer.

9. A semiconductor device comprising:
a first signal distribution structure having a top side and a bottom side, the first signal distribution structure comprising:
   a plurality of dielectric layers comprising a first dielectric layer and a second dielectric layer; and
   a plurality of first conductive layers comprising:
      a first conductive via extending through the first dielectric layer;
      a second conductive via extending through the second dielectric layer; and
      a trace extending laterally between and electrically connecting the first conductive via and the second conductive via;
a first semiconductor die on the top side of the first signal distribution structure;
a second semiconductor die on the top side of the first signal distribution structure;
a first encapsulating material on the top side of the first signal distribution structure and laterally surrounding the first and second semiconductor dies, wherein a top side of the first semiconductor die and a top side of the second semiconductor die are exposed from the first encapsulating material;
a second encapsulating material on at least: the top side of the first semiconductor die, the top side of the second semiconductor die, a top side and lateral sides of the first encapsulating material, and lateral sides of the first signal distribution structure; and
a second signal distribution structure on a bottom side of the first signal distribution structure and on a bottom side of the second encapsulating material.

10. The semiconductor device of claim 9, wherein a top side of the first encapsulating material, a top side of the first semiconductor die, and a top side of the second semiconductor die are coplanar.

11. The semiconductor device of claim 9, wherein the second encapsulating material directly contacts and covers a top side of the first semiconductor die, a top side of the second semiconductor die, and a top side of the first encapsulating material.

12. The semiconductor device of claim 9, wherein the first semiconductor die and the second semiconductor die are the only electronic components on the second signal distribution structure.

13. The semiconductor device of claim 12, wherein the first semiconductor die and the second semiconductor die are the only electronic components on the first signal distribution structure.

14. The semiconductor device of claim 9, wherein none of the second encapsulating material is directly between the first semiconductor die and the second semiconductor die.

15. The semiconductor device of claim 9, comprising a plurality of package interconnection structures on a bottom side of the second signal distribution structure, wherein at least one of the plurality of package interconnection structures is entirely laterally outside of a footprint of all electronic components on a top side of the second signal distribution structure.

16. The semiconductor device of claim 9, wherein the second encapsulating material comprises a molded material.

17. The semiconductor device of claim 1, wherein the trace and the second conductive via are portions of a same plated metal layer.

18. A method of manufacturing a semiconductor device, the method comprising:
- providing a first signal distribution structure having a top side and a bottom side, the first signal distribution structure comprising:
  - a plurality of dielectric layers comprising a first dielectric layer and a second dielectric layer; and
  - a plurality of first conductive layers comprising:
    - a first conductive via extending through the first dielectric layer;
    - a second conductive via extending through the second dielectric layer; and
    - a trace extending laterally between and electrically connecting the first conductive via and the second conductive via;
- providing a first semiconductor die on the top side of the first signal distribution structure;
- providing a second semiconductor die on the top side of the first signal distribution structure;
- providing a first encapsulating material on the top side of the first signal distribution structure and laterally surrounding the first and second semiconductor dies;
- providing a second encapsulating material on at least: the top side of the first semiconductor die, the top side of the second semiconductor die, a top side and lateral sides of the first encapsulating material, and lateral sides of the first signal distribution structure; and
- providing a second signal distribution structure on a bottom side of the first signal distribution structure and on a bottom side of the second encapsulating material, wherein:
  - all lateral sides of the trace are separated from the first encapsulating material by at least one intervening layer of the first signal distribution structure; and/or
  - a top side of the first semiconductor die and a top side of the second semiconductor die are exposed from the first encapsulating material.

19. The method of claim 18, wherein all lateral sides of the trace are separated from the first encapsulating material by at least one intervening layer of the first signal distribution structure.

20. The method of claim 18, wherein a respective top side of each of the first and second semiconductor dies is exposed from the first encapsulating material.

* * * * *